(12) United States Patent
Phelan

(10) Patent No.: US 6,256,249 B1
(45) Date of Patent: Jul. 3, 2001

(54) METHOD FOR HIDDEN DRAM REFRESH

(75) Inventor: Cathal G. Phelan, Mountain View, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/631,164

(22) Filed: Aug. 3, 2000

Related U.S. Application Data

(60) Provisional application No. 60/173,791, filed on Dec. 30, 1999.

(51) Int. Cl.[7] .................................................. G11C 7/00
(52) U.S. Cl. ...................................... 365/222; 365/189.04
(58) Field of Search .............................. 365/222, 189.08, 365/149, 189.04

(56) References Cited

U.S. PATENT DOCUMENTS

| | | | | |
|---|---|---|---|---|
| 4,112,513 | * | 9/1978 | Elsner | 365/222 |
| 4,203,159 | * | 5/1980 | Wandlass | 365/222 |
| 4,758,993 | * | 7/1988 | Takemae | 365/222 |
| 4,879,692 | * | 11/1989 | Tokusnige | 365/222 |
| 4,914,630 | * | 4/1990 | Fujishima | 365/189.04 |
| 5,291,443 | * | 3/1994 | Lim | 365/189.04 |
| 6,134,169 | * | 10/2000 | Tanaka | 365/222 |
| 6,154,409 | * | 11/2000 | Huang | 365/222 |

\* cited by examiner

*Primary Examiner*—Tan T. Nguyen
(74) *Attorney, Agent, or Firm*—Christopher P. Maiorana, P.C.

(57) ABSTRACT

An apparatus comprising a memory and a logic circuit. The memory may comprise a plurality of storage elements configured to read and write data in response to a first internal address signal and a second internal address signal. The logic circuit may be configured to generate either (i) the first and the second internal address signals when accessing one of the storage elements for a read or a write operation or (ii) the first internal address signal when accessing one of the storage elements for a read refresh operation.

14 Claims, 4 Drawing Sheets

METHOD FOR HIDDEN DRAM REFRESH

This application claims the benefit of U.S. Provisional Application No. 60/173,791, filed Dec. 30, 1999 and is hereby incorporated by reference in its entirety.

FIELD OF THE INVENTION

The present invention relates to memory devices generally and, more particularly, to a method for integrating a refresh cycle and a read data/write-back data cycle of a dynamic random access memory (DRAM).

BACKGROUND OF THE INVENTION

Referring to FIG. 1, a diagram illustrating a conventional dynamic random access memory (DRAM) 10 is shown. The conventional DRAM preserves data during periodic absences of power by implementing a memory cell 12 as a capacitor 14 and an access transistor 16. The conventional DRAM uses a single memory cell 12 for each bit of data stored. A sense amplifier 18 compares a signal received from the memory cell 12 via a bitline 20 with a reference signal REF to determine a stored value. The memory cell 12 is accessed using a single wordline 22.

Since the charge on the capacitor 14 will slowly leak away, the cells need to be "refreshed" once every few milliseconds. In order to refresh the cells, the DRAM typically requires an additional cycle. During the normal cycle, the DRAM will read data and write-back data. During a refresh cycle, the DRAM will (i) read data and write-back data as in the normal cycle and (ii) perform another read that is not intended for user access but rather to refresh the read data to prevent degradation. While effectively preserving the data, the additional refresh cycle makes the DRAM slower than a static random access memory (SRAM).

A static random access memory (SRAM) has only one cycle during which the chip either reads data or writes data. The SRAM is generally faster than other types of memory that require multiple cycles. Static random access memory requires more die space and must be constantly powered to maintain stored data.

It would be desirable to have a DRAM that could be refreshed at the same time as a normal access regardless of where the data is to be refreshed or the data to be accessed is stored.

SUMMARY OF THE INVENTION

The present invention concerns an apparatus comprising a memory and a logic circuit. The memory may comprise a plurality of storage elements configured to read and write data in response to a first internal address signal and a second internal address signal. The logic circuit may be configured to generate either (i) the first and the second internal address signals when accessing one of the storage elements for a read or a write operation or (ii) the first internal address signal when accessing one of the storage elements for a read refresh operation.

The objects, features and advantages of the present invention include providing a method and/or apparatus for increasing the performance of a DRAM chip by incorporating the refresh cycle into the read data/write-back data cycle.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
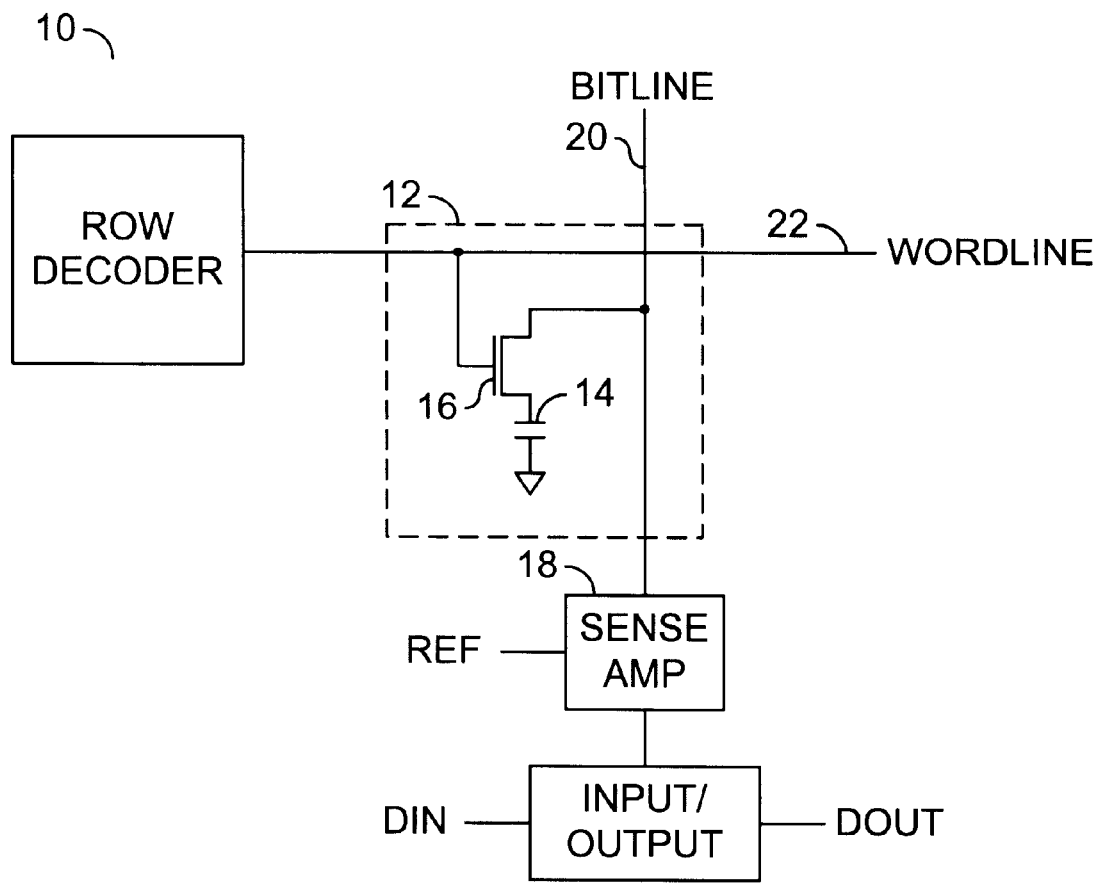
FIG. 1 is a block diagram illustrating a conventional dynamic random access memory storage element.
Figure 2:
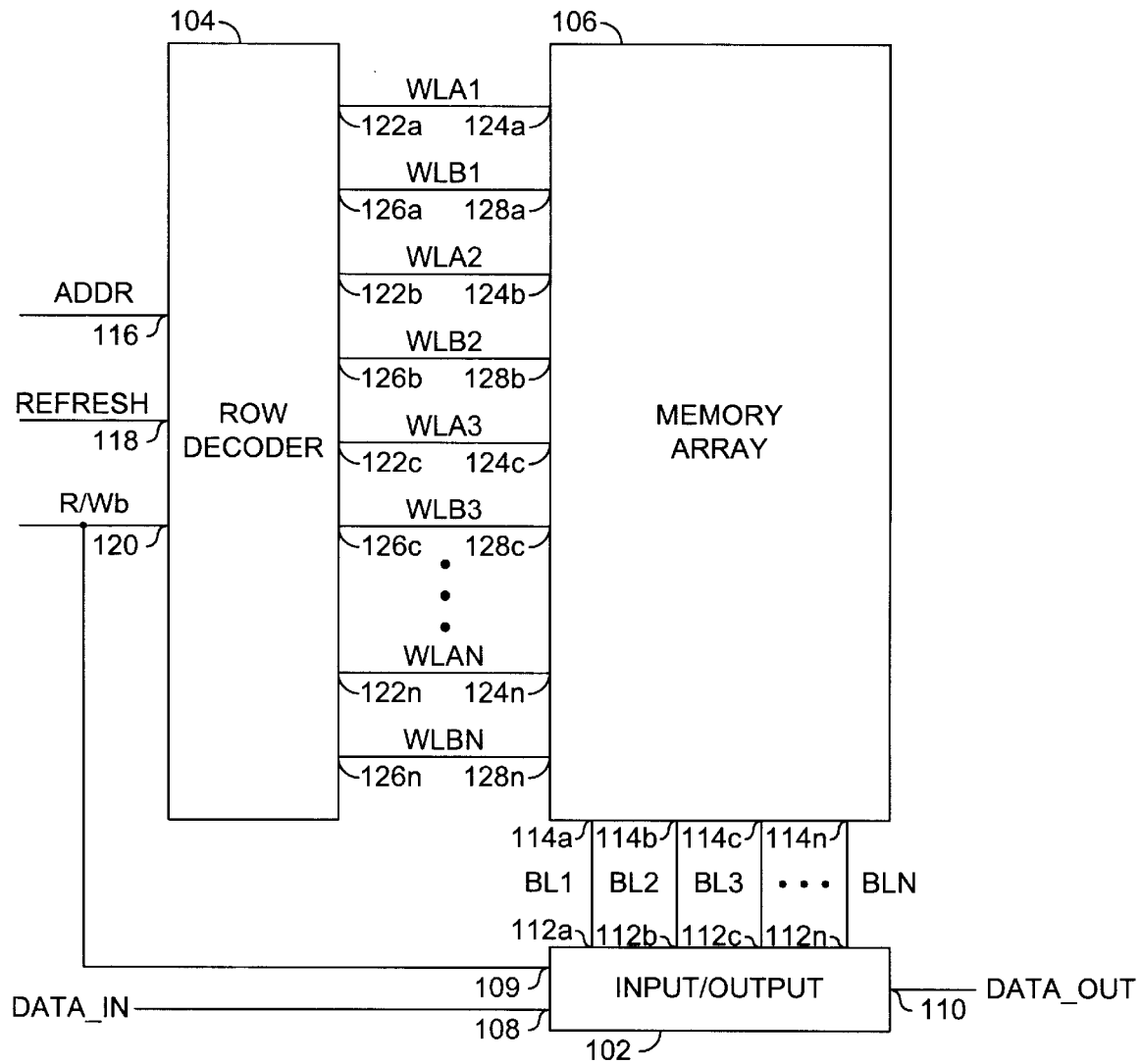
FIG. 2 is a block diagram of a preferred embodiment of the present invention.

Referring to FIG. 2, a diagram of a circuit 100 is shown in accordance with a preferred embodiment of the present invention. In one example, the circuit 100 may comprise a dynamic random access memory (DRAM). The circuit 100 generally comprises an input/output circuit 102, a row decoder 104, and a memory array 106. The input/output circuit 102 may have an input 108 that may receive a signal (e.g., DATA_IN), an input 109 that may receive a control signal (e.g., R/Wb), an output 110 that may present a signal (e.g., DATA_OUT), and a number of input/outputs 112a–112n that may receive or present a number of signals (e.g., BL1–BLN) to a number of input/outputs 114a–114n of the memory array 106.

The signal DATA_IN may contain data to be stored in the memory array 106. The circuit 102 may be configured to generate the signals BL1–BLN in response to the signals DATA_IN and R/Wb. The memory array 106 may be configured to store data presented by the signals BL1–BLN. The signals BL1–BLN may also contain data read from the memory array 106. The circuit 102 may be configured to generate the signal DATA_OUT in response to the signals BL1–BLN and R/Wb. The signals BL1–BLN may be, in one example, bitline signals.

The row decoder 104 may have an input 116 that may receive an address signal (e.g., ADDR), an input 118 that may receive a control signal (e.g., REFRESH), an input 120 that may receive the signal R/Wb, a number of outputs 122a–122n that may present a number of first internal address signals (e.g., WLA1–WLAN) to a number of inputs 124a–124n of the memory array 106, and a number of outputs 126a–126n that may present a number of second internal address signals (e.g., WLB1–WLBN) to a number of inputs 128a–128n of the memory array 106.

The signal ADDR may be an external address signal that may point to a location in the memory array 106 where (i) data from the signal DATA_IN is stored or (ii) data is read from for presentation in the signal DATA_OUT. The signal R/Wb may be a control signal that may determine whether data is written to or read from the memory array 106. The signal REFRESH may be a control signal configured to control a refresh cycle of the memory array 106. The signals WLA1–WLAN and WLB1–WLBN may be, in one example, wordline signals.

The various signals are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

The row decoder 104 may be configured to generate the signals WLA1–WLAN and WLB1–WLBN in response to the signals ADDR, R/Wb, and REFRESH. The row decoder 104 will generally present a pair of signals (e.g., WLA1 and WLB2, WLA2 and WLB2, . . . , WLAN and WLBN) in order to read or write to a particular location in the memory array 106. The row decoder 104 will generally present a single signal (e.g., WLA1 or WLB1, etc.) when reading a location in the memory array 106 for a refresh operation. The row decoder 104 may be configured to access a first location in the memory array 106 for a read operation and a second location in the memory array 106 for a refresh operation at the same time. For example, the row decoder 104 may be configured to generate three signals (e.g., WLAi, WLBi, and WLAj, where i is not equal to j) at the same time.

Figure 3:
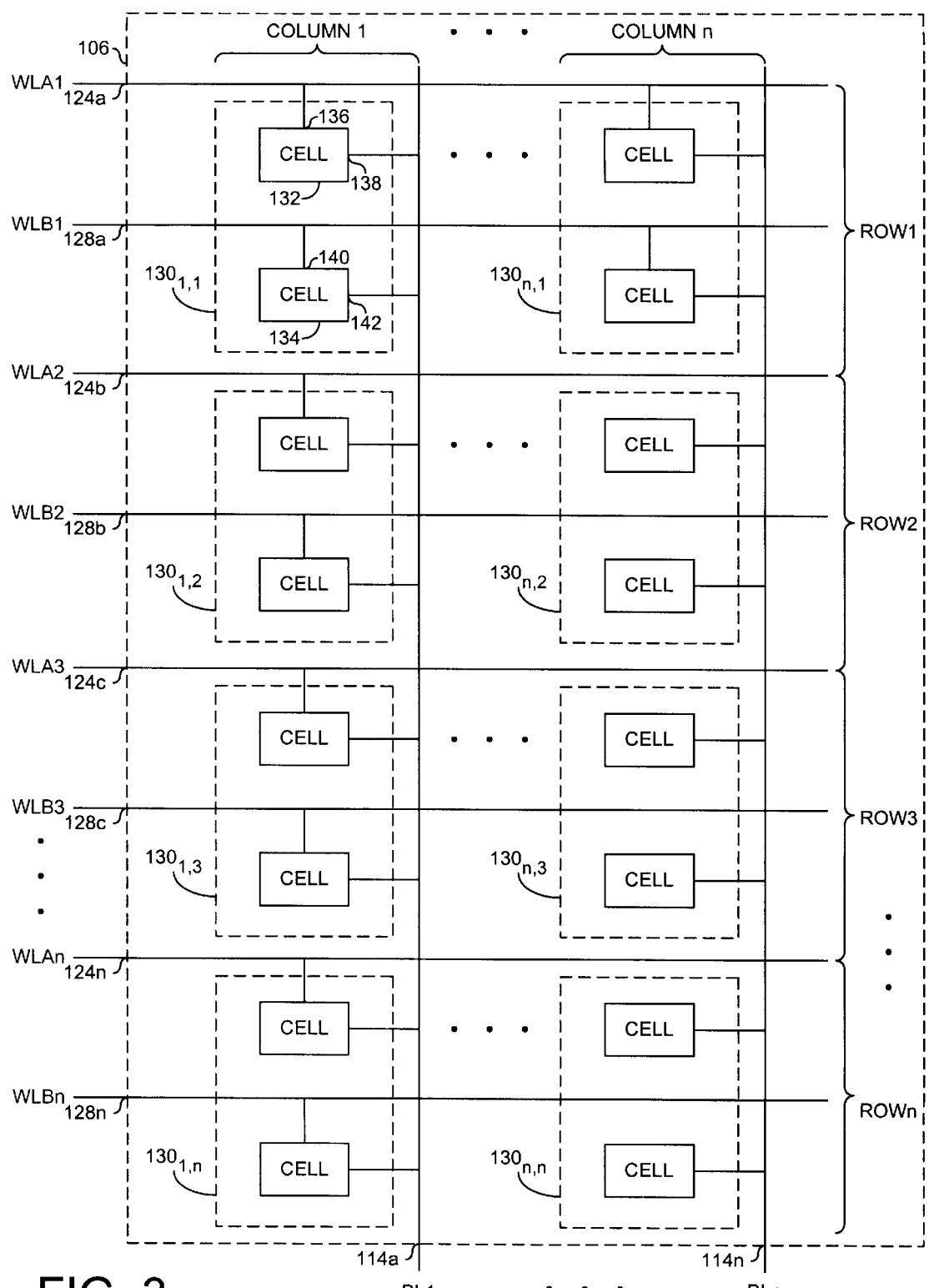
FIG. 3 is a detailed block diagram of a memory configuration in accordance with the present invention.

Referring to FIG. 3, a detailed block diagram illustrating an implementation of the memory array 106 is shown. The memory array 106 may comprise a plurality of storage elements $130_{1,1}$–$130_{n,n}$. The storage elements $130_{1,1}$–$130_{n,n}$ may be arranged in a number of rows and a number of columns. Each of the storage elements in a row (e.g., $130_{1,i}$–$130_{n,i}$) will generally receive the signals WLAi and WLBi. Each of the storage elements in a column (e.g., $130_{i,1}$–$130_{i,n}$) are generally connected to a bitline (e.g., BLi). Each of the storage elements (e.g., $130_{i,j}$) may be configured to generate or receive the bitline signal BLj in response to the wordline signals WLAi and WLBi, where i is the row and j is the column of the storage element $130_{ij}$. Each storage element (e.g., $130_{i,j}$) may be further configured to generate a bitline signal BLj that has a value proportional to the number of wordlines WLAi and WLBi that are turned on. For example, when the wordlines WLAi and WLBi are both turned on, the signal BLj will generally have a value about twice as large as when only the wordline WLAi or the wordline WLBi is turned on. However, the particular pro-portion of the signal BLj may vary according to the design criteria of a particular implementation.

The storage elements $130_{1,1}$–$130_{n,n}$ may comprise, in one example, a memory cell 132 and a memory cell 134. The memory cell 132 may have an input 136 that may receive the signal WLA and an output 138 that may be connected to the bitline BL. The memory cell 134 may have an input 140 that may receive the signal WLB and an output 142 the may be connected to the bitline BL.

When a read operation is being performed, both memory cells 132 and 134 of a storage element 130 will generally present a signal to a bitline BL in response to the wordline signals WLA and WLB. When a read refresh operation is being performed, only one of the memory cells 132 and 134 of a storage element will present a signal to the bitline BL. Since the row decoder 104 may be configured to access one row for a read operation and another row for a refresh operation, three memory cells may present signals to the bitline BL at the same time. TABLE 1 summarizes four possible combinations of charge on the bitline BL that may be generated by the memory array 106 in response to the wordline signals from the row decoder 104 as compared to a reference charge (e.g., C).

TABLE 1

| READ Cell 132 | READ Cell 134 | REFRESH Cell 132 or 134 | BITLINE Sense Amp Charge |
|---|---|---|---|
| 0 | 0 | 0 | 0 |
| 0 | 0 | 1 | 1C |
| 1 | 1 | 0 | 2C |
| 1 | 1 | 1 | 3C |

The input/output circuit 102 may comprise a sense amplifier that may be configured to distinguish between the four possible combinations to determine the contents of two storage elements. Since only "1"s are generally destroyed by a read operation, the sense amplifiers may also be configured to determine whether a writeback is needed and the storage elements to which to writeback.

The circuit 100 may provide an access pattern comparable to a SRAM. The circuit 100 will generally have a read data and refresh cycle and a writeback data and refresh cycle. Although the memory array 106 will generally be twice the size of a conventional DRAM array, the memory array 106 will generally be only half the size of a comparable SRAM.

Figure 4:
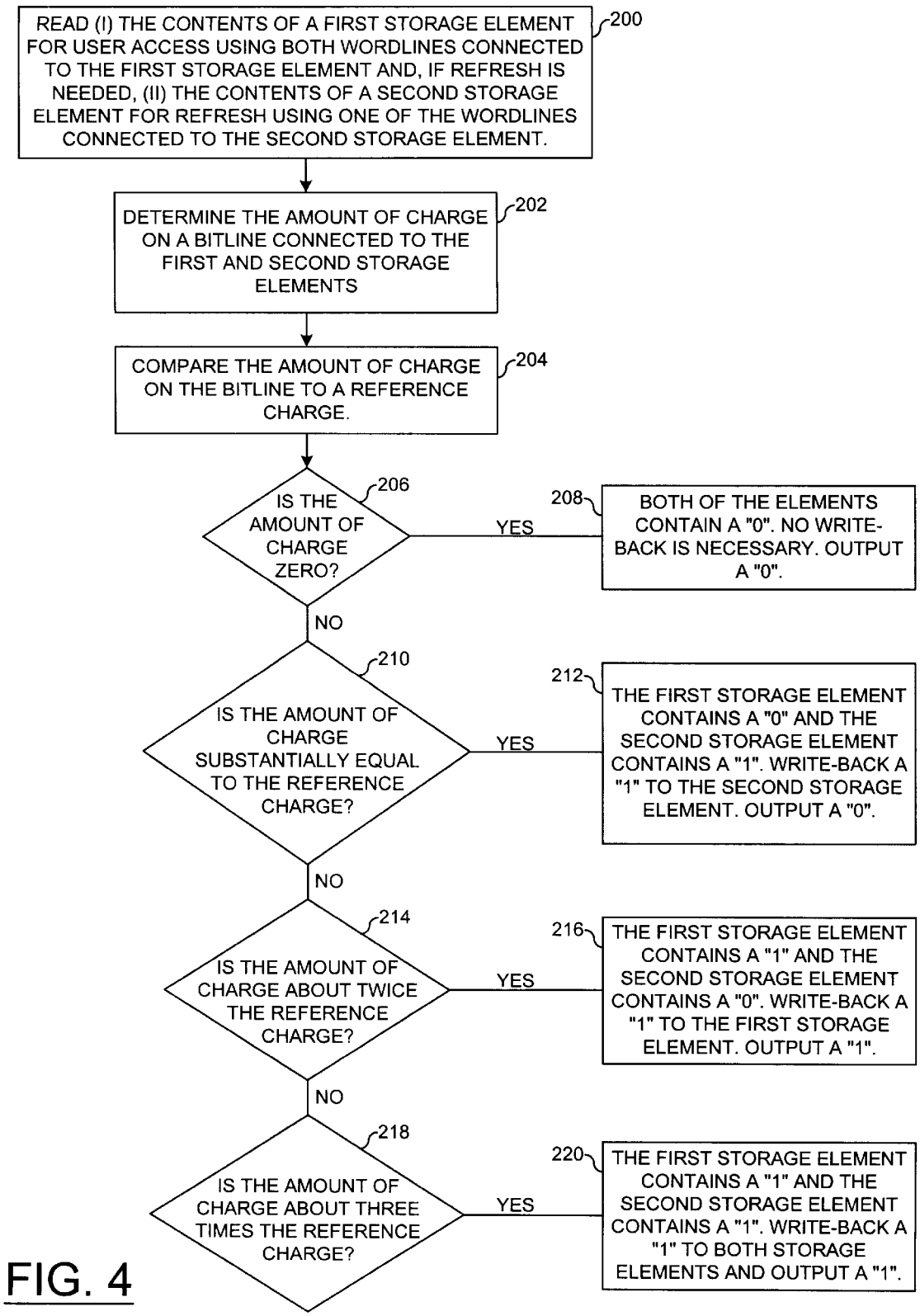
FIG. 4 is a flow diagram illustrating an example access operation of the present invention.

Referring to FIG. 4, a flow diagram illustrating an example access operation of the circuit 100 is shown. When the circuit 100 is accessed for a read operation and a refresh operation is needed, the circuit 100 may read from a first storage element pointed to by the signal ADDR by turning on both wordlines connected to the first storage element. During such a condition, the circuit 100 may read from a second storage element that is generally refreshed by turning on only one of the wordlines connected to the second storage element (e.g., block 200). The circuit 100 may be configured to determine the amount of charge that the two storage elements presented to a bitline (e.g., block 202). The circuit 100 may be further configured to compare the amount of charge to a predetermined reference value to determine the data that was stored in the first and second storage elements (e.g., block 204). If the amount of charge on the bitline is substantially zero, the first and second storage elements generally contain a "0". The circuit 100 may be configured to present a "0" as the signal DATA_OUT (e.g., blocks 206 and 208). Since a "0" is generally not destroyed by a read operation, no write-back is generally needed. If the amount of charge on the bitline is substantially equal to the reference value, the first storage element generally contains a "0" and the second storage element generally contains a "1". The circuit 100 may be configured to present a "0" as the signal DATA_OUT and write-back a "1" to the second storage element (e.g., blocks 210 and 212). If the amount of charge on the bitline is about twice the reference value, the first storage element generally contains a "1" and the second storage element generally contains a "0". The circuit 100 may be configured to present a "1" as the signal DATA_OUT and write-back a "1" to the first storage element (e.g., blocks 214 and 216). If the amount of charge on the bitline is about three times the reference value, the first storage element generally contains a "1" and the second storage element generally contains a "1". The circuit 100 may be configured to present a "1" as the signal DATA_OUT and write-back a "1" to the first and the second storage elements (e.g., blocks 218 and 220).

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a memory comprising a plurality of storage elements configured to store data in response to a first internal address signal and a second internal address signal, wherein each of said storage elements comprise a first memory cell and a second memory cell; and
   a logic circuit configured to generate either (i) said first and said second internal address signals when accessing one of said storage elements for a read or a write operation or (ii) said first internal address signal when accessing one of said storage elements for a read refresh operation.

2. The apparatus according to claim 1, wherein said first and said second memory cell comprise a capacitor and a transistor.

3. The apparatus according to claim 1, wherein said first memory cell generates an output signal in response to said first internal address signal.

4. The apparatus according to claim 1, wherein said second memory cell generates an output signal in response to said second internal address signal.

5. The apparatus according to claim 1, wherein said logic circuit comprises a row decoder.

6. The apparatus according to claim 1, wherein two of said storage elements are connected to a bitline and accessed at the same time, one for a read operation and the other for a read refresh operation.

7. The apparatus according to claim 6, further comprising one or more sense amplifiers configured to determine the contents of said two storage elements connected to a bitline.

8. The apparatus according to claim 7, wherein said determination is based on a ratio of (i) an amount charge presented by said storage elements and (ii) a predetermined reference value.

9. The apparatus according to claim 8, wherein said charge ratio is 2:1.

10. The apparatus according to claim 1, wherein said apparatus comprises a dynamic random access memory having a hidden refresh.

11. The apparatus according to claim 1, wherein said storage elements are configured to generate a substantially larger signal in response to a normal read operation than in response to a read refresh operation.

12. An apparatus comprising:

means for storing data in response to a first internal address signal and a second internal address signal comprising a number of storage elements, wherein said storage elements comprise a first memory cell and a second memory cell; and means for generating (i) said first and said second internal address signals when accessing one of said storage elements for a read or a write operation and (ii) said first internal address signal when accessing one of said storage elements for a read refresh operation.

13. A method for providing a hidden refresh in a dynamic random access memory comprising the steps of:

configuring a plurality of storage elements to store data in response to a first internal address signal and a second internal address signal, wherein said storage elements comprise a first memory cell and a second memory cell; and generating (i) said first and said second internal address signals when accessing one of said storage elements for a read or a write operation and (ii) said first internal address signal when accessing one of said storage elements for a read refresh operation.

14. The method according to claim 13, wherein two of said storage elements connected to a bitline are accessed at the same time, one for a read operation and the other for a read refresh operation.

* * * * *